(12) United States Patent
Zhong et al.

(10) Patent No.: US 8,229,253 B2
(45) Date of Patent: Jul. 24, 2012

(54) ELECTROMECHANICAL DEVICE CONFIGURED TO MINIMIZE STRESS-RELATED DEFORMATION AND METHODS FOR FABRICATING SAME

(75) Inventors: Fan Zhong, Fremont, CA (US); Lior Kogut, Haifa (IL)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 206 days.

(21) Appl. No.: 12/825,214

(22) Filed: Jun. 28, 2010

(65) Prior Publication Data

US 2010/0265563 A1    Oct. 21, 2010

Related U.S. Application Data

(63) Continuation of application No. 11/506,594, filed on Aug. 18, 2006, now Pat. No. 7,747,109.

(60) Provisional application No. 60/710,019, filed on Aug. 19, 2005.

(51) Int. Cl.
*G02F 1/01* (2006.01)

(52) U.S. Cl. .......................................................... 385/1
(58) Field of Classification Search ........................ 385/1
See application file for complete search history.

(56) References Cited

U.S. PATENT DOCUMENTS

| | | | |
|---|---|---|---|
| 4,666,254 A | 5/1987 | Itoh et al. | |
| 4,681,403 A | 7/1987 | te Velde et al. | |
| 4,710,732 A | 12/1987 | Hornbeck | |
| 5,018,256 A | 5/1991 | Hornbeck | |
| 5,028,939 A | 7/1991 | Hornbeck et al. | |
| 5,078,479 A | 1/1992 | Vuilleumier | |
| 5,083,857 A | 1/1992 | Hornbeck | |
| 5,233,456 A | 8/1993 | Nelson | |
| 5,312,512 A | 5/1994 | Allman et al. | |
| 5,461,411 A | 10/1995 | Florence et al. | |
| 5,488,505 A | 1/1996 | Engle | |
| 5,497,262 A | 3/1996 | Kaeriyama | |
| 5,499,037 A | 3/1996 | Nakagawa et al. | |
| 5,526,951 A | 6/1996 | Bailey | |

(Continued)

FOREIGN PATENT DOCUMENTS

CN    1378245    11/2002

(Continued)

OTHER PUBLICATIONS

Office Action dated Jun. 8, 2010 in Chinese App. No. 200680030211.3.

(Continued)

*Primary Examiner* — Uyen Chau N Le
*Assistant Examiner* — Hoang Tran
(74) *Attorney, Agent, or Firm* — Knobbe Martens Olson & Bear LLP

(57) ABSTRACT

Embodiments of MEMS devices include a movable layer supported by overlying support structures, and may also include underlying support structures. In one embodiment, the residual stresses within the overlying support structures and the movable layer are substantially equal. In another embodiment, the residual stresses within the overlying support structures and the underlying support structures are substantially equal. In certain embodiments, substantially equal residual stresses are be obtained through the use of layers made from the same materials having the same thicknesses. In further embodiments, substantially equal residual stresses are obtained through the use of support structures and/or movable layers which are mirror images of one another.

20 Claims, 14 Drawing Sheets

U.S. PATENT DOCUMENTS

| | | | |
|---|---|---|---|
| 5,600,383 | A | 2/1997 | Hornbeck |
| 5,610,624 | A | 3/1997 | Bhuva |
| 5,622,814 | A | 4/1997 | Miyata et al. |
| 5,633,652 | A | 5/1997 | Kanbe et al. |
| 5,646,768 | A | 7/1997 | Kaeriyama |
| 5,650,834 | A | 7/1997 | Nakagawa et al. |
| 5,753,418 | A | 5/1998 | Tsai et al. |
| 5,801,084 | A | 9/1998 | Beasom et al. |
| 6,008,123 | A | 12/1999 | Kook et al. |
| 6,040,937 | A | 3/2000 | Miles |
| 6,097,145 | A | 8/2000 | Kastalsky et al. |
| 6,219,015 | B1 | 4/2001 | Bloom et al. |
| 6,248,654 | B1 | 6/2001 | Lee et al. |
| 6,356,254 | B1 | 3/2002 | Kimura |
| 6,392,781 | B1 | 5/2002 | Kim et al. |
| 6,436,504 | B2 | 8/2002 | Miyamoto et al. |
| 6,452,124 | B1 | 9/2002 | York et al. |
| 6,452,465 | B1 | 9/2002 | Brown et al. |
| 6,513,911 | B1 | 2/2003 | Ozaki et al. |
| 6,525,352 | B1 | 2/2003 | Muller et al. |
| 6,555,904 | B1 | 4/2003 | Karpman |
| 6,624,944 | B1 | 9/2003 | Wallace et al. |
| 6,653,997 | B2 | 11/2003 | Van Gorkom et al. |
| 6,674,562 | B1 | 1/2004 | Miles |
| 6,803,534 | B1 | 10/2004 | Chen et al. |
| 6,822,628 | B2 | 11/2004 | Dunphy et al. |
| 6,912,022 | B2 | 6/2005 | Lin et al. |
| 6,980,350 | B2 | 12/2005 | Hung et al. |
| 7,012,726 | B1 | 3/2006 | Miles |
| 7,053,737 | B2 | 5/2006 | Schwartz et al. |
| 7,064,883 | B2 | 6/2006 | Payne et al. |
| 7,123,216 | B1 | 10/2006 | Miles |
| 7,145,213 | B1 | 12/2006 | Ebel |
| 7,161,730 | B2 | 1/2007 | Floyd |
| 7,172,915 | B2 | 2/2007 | Lin et al. |
| 7,221,495 | B2 | 5/2007 | Miles et al. |
| 7,300,162 | B2 | 11/2007 | Huibers |
| 7,309,658 | B2 | 12/2007 | Lazovsky et al. |
| 7,327,510 | B2 | 2/2008 | Cummings et al. |
| 7,375,404 | B2 | 5/2008 | Park et al. |
| 7,385,800 | B2 | 6/2008 | Morris, III et al. |
| 2002/0031155 | A1 | 3/2002 | Tayebati et al. |
| 2002/0054422 | A1 | 5/2002 | Carr et al. |
| 2002/0117728 | A1 | 8/2002 | Brosnihhan et al. |
| 2002/0132389 | A1 | 9/2002 | Patel et al. |
| 2003/0036215 | A1 | 2/2003 | Reid |
| 2003/0054588 | A1 | 3/2003 | Patel et al. |
| 2003/0102771 | A1 | 6/2003 | Akiba et al. |
| 2003/0111439 | A1 | 6/2003 | Fetter et al. |
| 2003/0119221 | A1 | 6/2003 | Cunningham et al. |
| 2003/0179527 | A1 | 9/2003 | Chea |
| 2004/0008438 | A1 | 1/2004 | Sato |
| 2004/0051929 | A1 | 3/2004 | Sampsell et al. |
| 2004/0100677 | A1 | 5/2004 | Huibers et al. |
| 2004/0124452 | A1 | 7/2004 | Wellhausen et al. |
| 2004/0140557 | A1 | 7/2004 | Sun et al. |
| 2004/0150869 | A1 | 8/2004 | Kasai |
| 2004/0150936 | A1 | 8/2004 | Chea |
| 2004/0150939 | A1 | 8/2004 | Huff |
| 2004/0166603 | A1 | 8/2004 | Carley |
| 2004/0179445 | A1 | 9/2004 | Park |
| 2004/0207497 | A1* | 10/2004 | Hsu et al. ............... 335/10 |
| 2004/0217264 | A1 | 11/2004 | Wood et al. |
| 2005/0002082 | A1 | 1/2005 | Miles |
| 2005/0036095 | A1 | 2/2005 | Yeh et al. |
| 2005/0194867 | A1 | 9/2005 | Kawakubo et al. |
| 2005/0237743 | A1 | 10/2005 | Payne et al. |
| 2006/0024880 | A1 | 2/2006 | Chui et al. |
| 2006/0056001 | A1 | 3/2006 | Taguchi et al. |
| 2007/0040777 | A1 | 2/2007 | Cummings |

FOREIGN PATENT DOCUMENTS

| | | |
|---|---|---|
| CN | 1 655 373 | 8/2005 |
| JP | 2000-306515 | 11/2000 |
| JP | 2000-340553 | 12/2000 |
| JP | 2002-287047 | 3/2001 |
| JP | 2002-023068 | 1/2002 |
| JP | 2002-023070 | 1/2002 |
| JP | 2002023068 A * | 1/2002 |
| JP | 2002-040238 | 2/2002 |
| JP | 2002 062493 | 2/2002 |
| JP | 2003-305697 | 10/2003 |
| JP | 2004-314251 | 11/2004 |
| JP | 2005-183976 | 7/2005 |
| WO | WO 01/14248 | 3/2001 |
| WO | WO 02/059977 | 8/2002 |

OTHER PUBLICATIONS

Office Action dated Jun. 9, 2011 in Chinese App. No. 200680030211.3.
Notice of Reasons for Rejection dated Jul. 26, 2011 in Japanese App. No. 2008-527197.
Office Action dated Jan. 19, 2010 in Chinese App. No. 200680030211.3.
Office Action dated Mar. 30, 2010 in Chinese App. No. 200680030133.7.
Office Action dated Jul. 25, 2011 in Chinese App. No. 200680030133.7.
Notice of Reasons for Rejection dated Aug. 16, 2011 in Japanese App. No. 2008-527198.
Aratani K. et al. Surface Micromachined Tuneable Interferometer Array, Sensors and Actuators A, Elsevier Sequoia S.A., Lausanne, CH, A43(1/3):17-23, May 1, 1994.
Office Action dated Jul. 2, 2009 in U.S. Appl. No. 11/506,600.
ISR and WO for PCT/US2006/032516 filed Aug. 17, 2006.
IPRP for PCT/US2006/032516 filed Aug. 17, 2006.
ISR and WO for PCT/US2006/032691 filed Aug. 17, 2006.
IPRP for PCT/US2006/032691 filed Aug. 17, 2006.
ISR and WO for PCT/US2006/032511 filed Aug. 17, 2006.
IPRP for PCT/US2006/032511 filed Aug. 17, 2006.
Butler et al., An Embedded Overlay Concept for Microsystems Packaging, IEEE Transactions on Advanced Packaging IEEE USA, 23(4):617-622 (2000).
Goossen et al., Silicon Modulator Based on Mechanically-Active Anti-Reflection Layer with 1Mbit/sec Capability for Fiber-in-the-Loop Applications, IEEE Photonics Technology Letters, pp. 1119-1121 (Sep. 1994).
Gosch, West Germany Grabs the Lead in X-Ray Lithography, Electronics, pp. 78-80 (Feb. 5, 1987).
Jerman et al., A Miniature Fabry-Perot Interferometer Fabricated Using Silicon Micromachining Techniques, IEEE Electron Devices Society (1988).
Office Action dated Jul. 28, 2008 in U.S. Appl. No. 11/506,594.
Office Action dated Jan. 23, 2009 in U.S. Appl. No. 11/506,594.
Office Action dated Jun. 25, 2009 in U.S. Appl. No. 11/506,594.
Official Action dated May 25, 2010 in European App. No. 06789884.1.
Office Action dated Oct. 18, 2010 in Chinese App. No. 200680030133.7.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

ELECTROMECHANICAL DEVICE CONFIGURED TO MINIMIZE STRESS-RELATED DEFORMATION AND METHODS FOR FABRICATING SAME

CROSS-REFERENCE TO RELATED APPLICATIONS

This application is a continuation of U.S. application Ser. No. 11/506,594, filed Aug. 18, 2006, now published as U.S. Publication No. 2007-0041076, which claims priority under 35 U.S.C. §119(e) to U.S. Provisional Application Ser. No. 60/710,019, filed Aug. 19, 2005, each of which is hereby incorporated by reference in its entirety.

BACKGROUND OF THE INVENTION

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of fabricating a MEMS device is provided, the method including providing a substrate, depositing an electrode layer over the substrate, depositing a sacrificial layer over the electrode layer, patterning the sacrificial layer to form apertures, depositing a movable layer over the sacrificial layer, forming support structures adjacent the movable layer and at least partially within apertures in the sacrificial layer, where the support structures include a material selected to minimize the tendency of the support structures to laterally deform relative to the movable layer.

In another embodiment, a MEMS device is provided, including a substrate, an electrode layer located over the substrate, a movable layer located over the electrode layer, where the movable layer is generally spaced apart from the electrode layer by an air gap, and rigid support structures formed adjacent the movable layer and at least partially within the depressions in the movable layer, where the rigid support structures comprise a material selected to minimize the tendency of the support structures to laterally deform relative to the movable layer.

In another embodiment, a method of fabricating a MEMS device is provided, the method including providing a substrate, depositing an electrode layer over the substrate, depositing a sacrificial layer over the electrode layer, patterning the sacrificial layer to form apertures, forming underlying support structures at least partially within the apertures, forming a movable layer over the underlying support structures, forming overlying support structures overlying the movable layer and at least partially within apertures in the sacrificial layer, wherein the support structures are configured to minimize deflection resulting from a tendency of the overlying support structure to laterally expand or contract with respect to the underlying support structure.

In another embodiment, a MEMS device is provided, including a substrate, an electrode layer located over the substrate, a movable layer located over the electrode layer, where the movable layer is generally spaced apart from the electrode layer by an air gap, underlying support structures formed under the movable layer, and overlying support structures formed over the movable layer, where at least some of the overlying support structures overly underlying support structures beneath the movable layer, and where said support structures are configured to minimize deflection resulting from a tendency of the overlying support structure to laterally expand or contract with respect to the underlying support structure.

In another embodiment, a MEMS device is provided, including first means for electrically conducting, second means for electrically conducting, and means for supporting the second conducting means over the first conducting means, where the second conducting means is movable relative to the first conducting means in response to generating electrostatic potential between the first and second conducting means, and where the supporting means are configured to minimize deflection resulting from a tendency of components within a support region to laterally expand or contract with respect to one another.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Individual MEMS elements, such as interferometric modulator elements, may be provided with support structures both within and at the edges of individual elements. In certain embodiments, these support structures may include "rivet" structures overlying a movable layer and/or "post" structures underlying the movable layer. Due to variations in both the residual stresses of the layers as deposited and stresses which result due to variations in operating conditions (e.g., internal strain or stresses caused by differences in the coefficients of thermal expansion), the movable layer may undesirably deflect, altering the operation of the MEMS device. Such undesirable stresses can be minimized or eliminated through material selection and symmetrical arrangement of support structures, such as support structures having the same material and thickness as either the movable layer or an underlying support structure. In further embodiments, stress mismatch between two layers within a MEMS device can be minimized when the layers are mirror images of one another.

Figure 1:
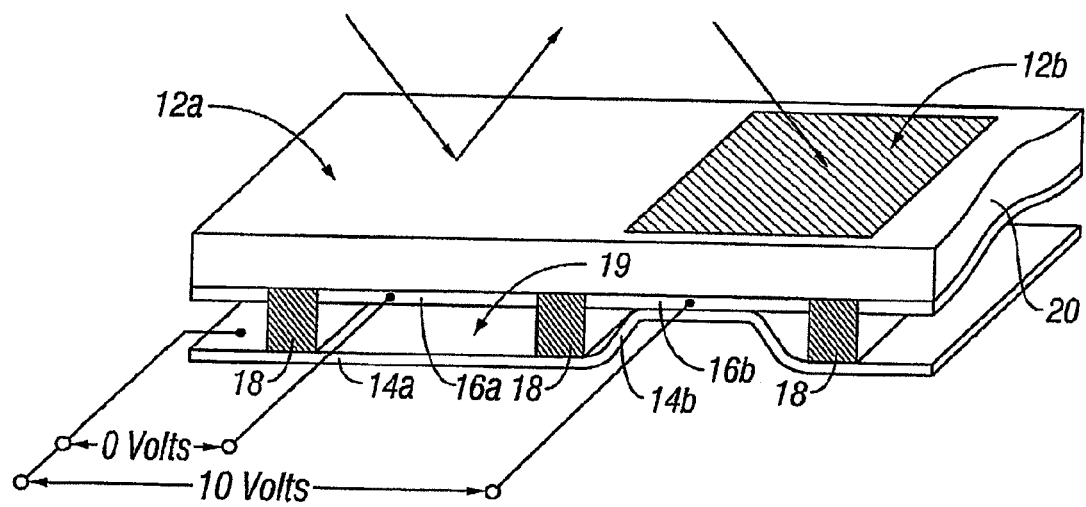
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
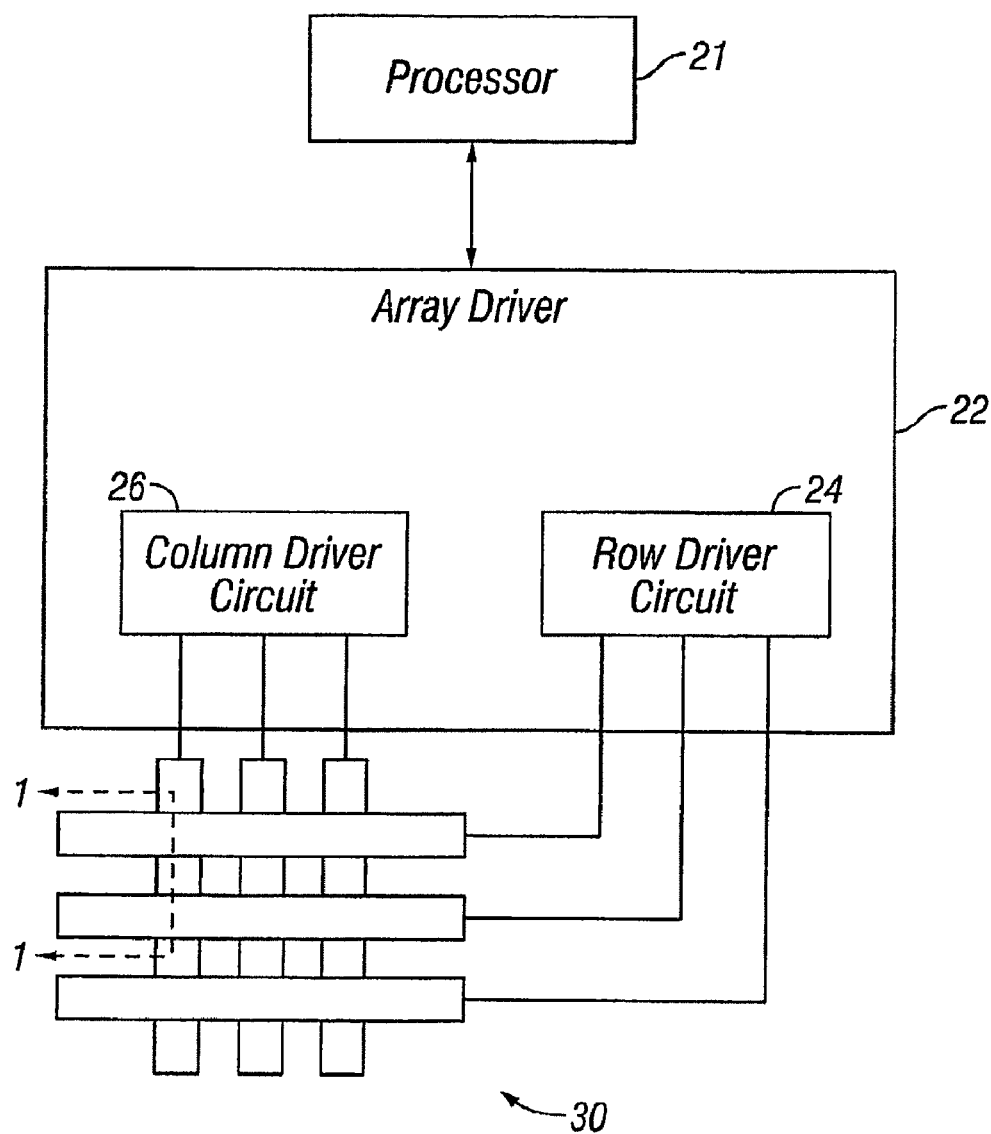
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
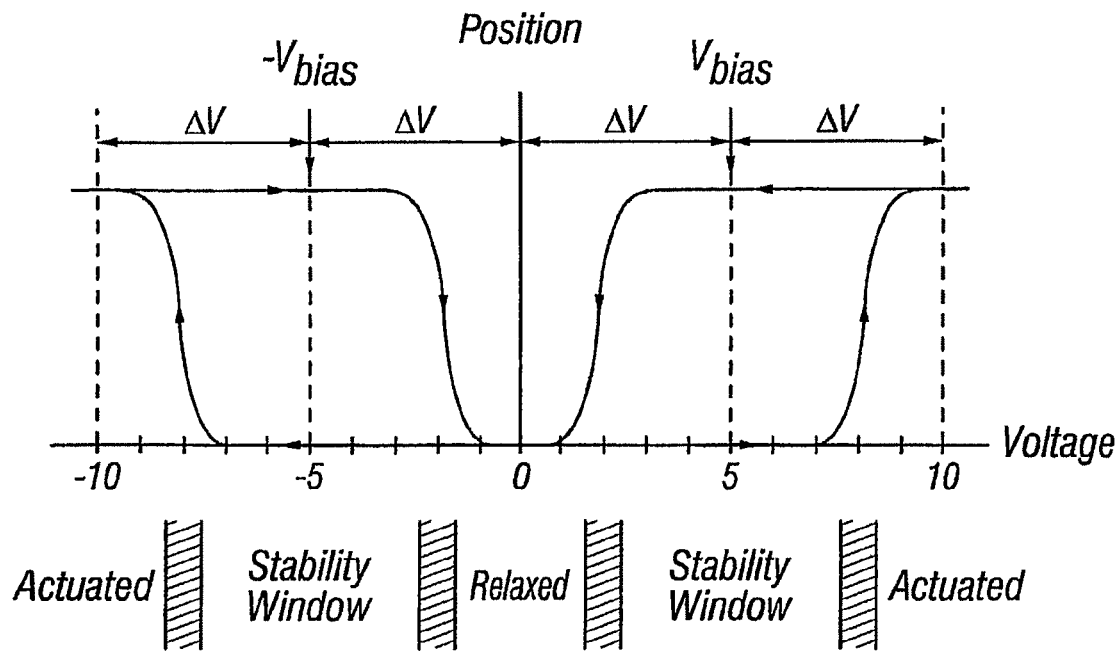
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
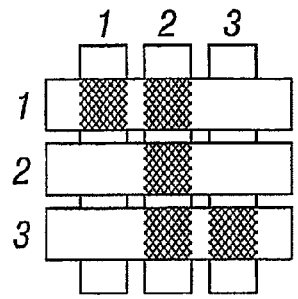
FIG. 5A illustrates one exemplary frame of display data in the 3×3 interferometric modulator display of FIG. 2.
Figure 5B:
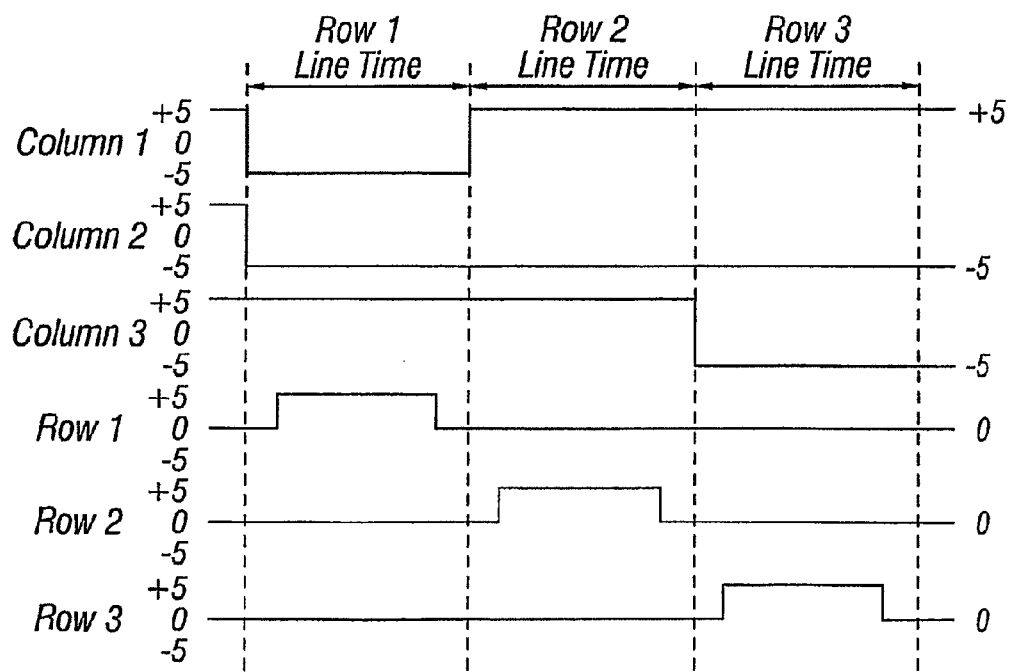
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
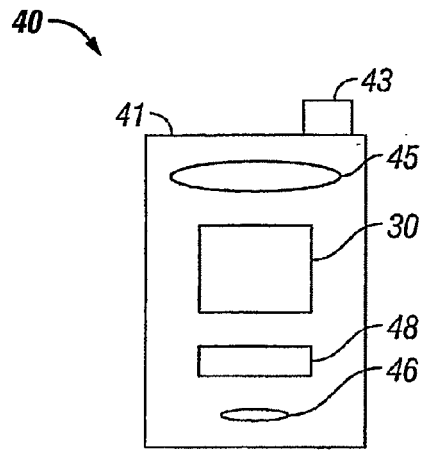
FIGS. 6A and 6B are system block diagrams illustrating an embodiment of a visual display device comprising a plurality of interferometric modulators.
Figure 6B:
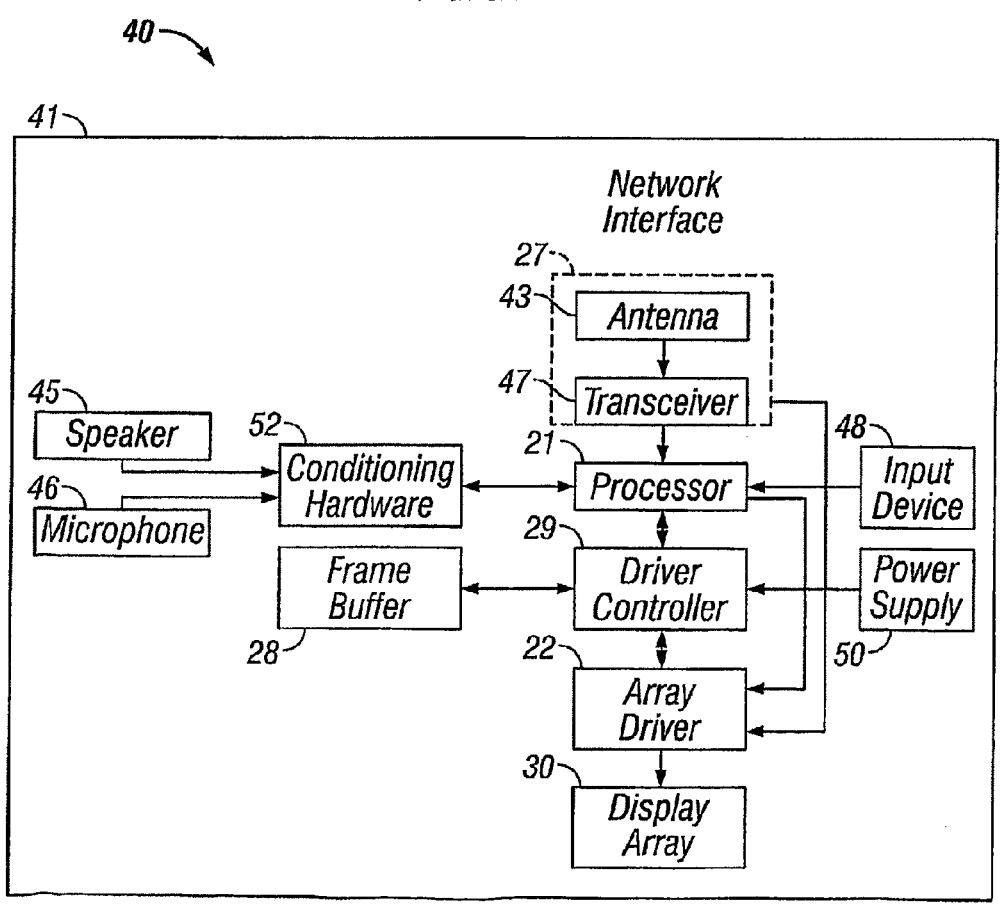

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, the array driver 22, and the display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
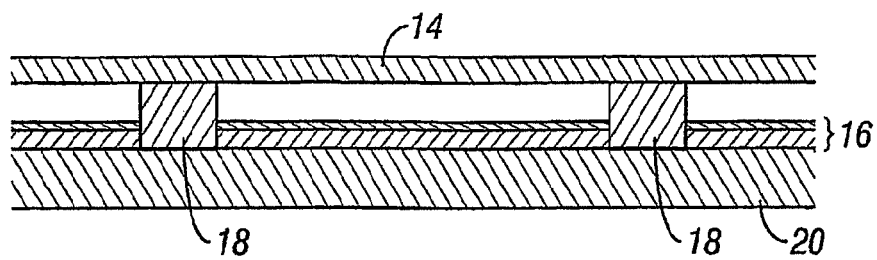
FIG. 7A is a cross section of the device of FIG. 1.
Figure 7B:
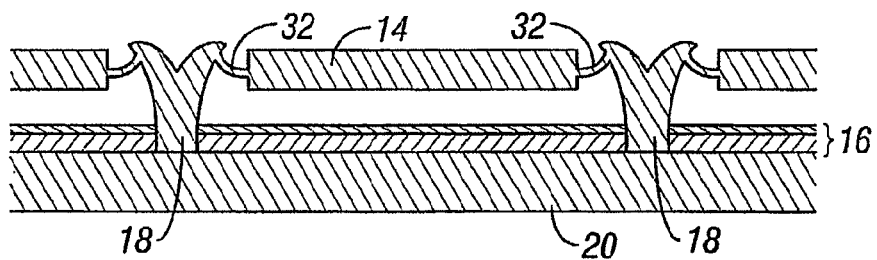
FIG. 7B is a cross section of an alternative embodiment of an interferometric modulator.
Figure 7C:
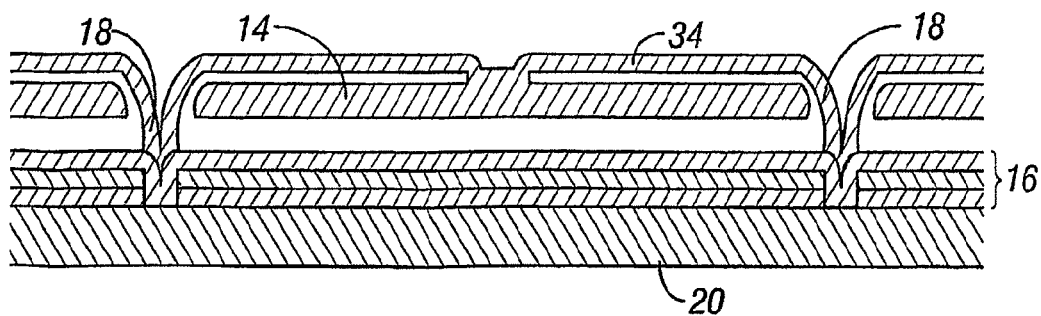
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can take the form of isolated pillars or posts and/or continuous walls or rails. The embodiment illustrated in FIG. 7D has support structures 18 that include support plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
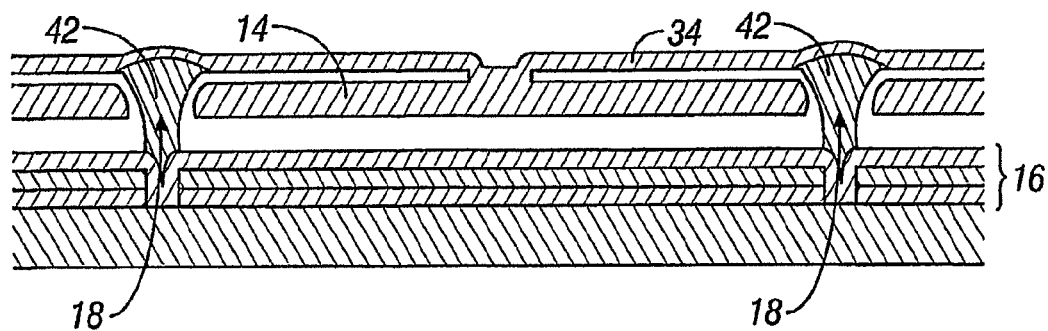
FIG. 7D is a cross section of yet another alternative embodiment of an interferometric modulator.
Figure 7E:
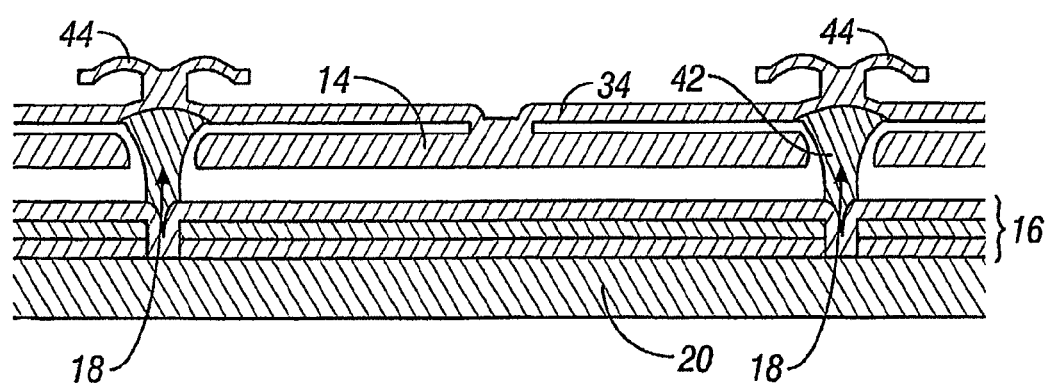
FIG. 7E is a cross section of an additional alternative embodiment of an interferometric modulator.

In certain embodiments, it may be desirable to provide additional support to a movable layer such as the movable reflective layer 14 illustrated in FIG. 7A, or the combination of mechanical layer 34 and movable reflective layer 14 of FIGS. 7C-7E. In optical MEMS devices, such as interferometric modulators, the movable layer may comprise a reflective sublayer and a mechanical sublayer, as will be discussed in greater detail below. Such support may be provided by a series of support structures which may be located along the edges of an individual modulator element and/or in the interior of such an element. In various embodiments, these support structures may be located either over or underneath a movable layer. In alternate embodiments, support structures may extend through an aperture formed in the mechanical layer, such that support is provided from both above and below the mechanical layer. As used herein, the term "rivet" generally refers to a patterned layer overlying a mechanical layer in a MEMS device, usually in a recess or depression in the post or support region, to lend mechanical support for the mechanical layer. Preferably, though not always, the rivet includes wings overlying an upper surface of the mechanical layer to add stability and predictability to the mechanical layer's movement. Similarly, support structures underlying a mechanical layer in a MEMS device to lend mechanical support for the mechanical layer are generally referred to herein as support "posts." In many of the embodiments herein, the preferred materials are inorganic for stability relative to organic resist materials.

Figure 8:
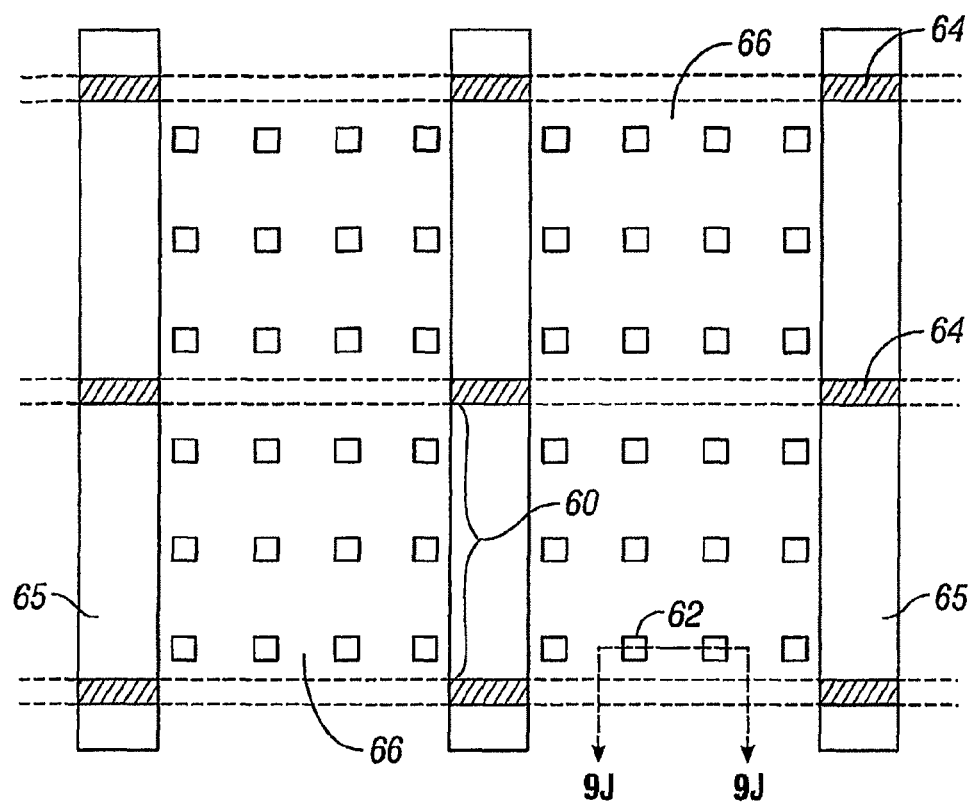
FIG. 8 is a top plan view of an array of interferometric modulator elements in which the individual elements comprise support structures.

An exemplary layout of such support structures is shown in FIG. 8, which depicts an array of MEMS elements. In certain embodiments, the array may comprise an array of interferometric modulators, but in alternate embodiments, the MEMS elements may comprise any MEMS device having a movable layer. It can be seen that support structures 62, which in the illustrated embodiment are overlying rivet structures but may in other embodiments include underlying post structures, are located both along the edges of a movable layer 66 and in the interior of a MEMS element, in this example an interferometric modulator element 60. Certain support structures may comprise rail structures 64, which extend across the gap 65 between two adjacent movable layers 66. It can be seen that movable layer 66 comprises a strip of deformable material extending through multiple adjacent elements 60 within the same column. The rail structures 64 run parallel with lower electrodes which define rows crossing the electrodes defined by the strips of the movable layer 66. The support structures 62 serve to stiffen the movable layer 66 within the elements or pixels 60.

Advantageously, these support structures 62 are made small relative to the surrounding area of the modulator element 60. As the support posts constrain deflection of the movable layer 66 and may generally be opaque, the area underneath and immediately surrounding the support structures 62 is not usable as active area in a display, as the movable layer in those areas is not movable to a fully actuated position (e.g., one in which a portion of the lower surface of the movable layer 14 of FIG. 7A is in contact with the upper surface of the optical stack 16). Because this may result in undesirable optical effects in the areas surrounding the post, a dark or "black" mask layer may advantageously be provided between the support structures and the viewer to avoid excessive reflection in these regions that may wash out the intended color.

In certain embodiments, these support structures may comprise a depression in the movable layer, along with a substantially rigid structure(s) above and/or below the movable layer which helps to maintain the shape. While such support structures may be formed of a polymer material, an inorganic material having greater rigidity is preferably used, and provides advantages over similar structures comprising polymeric materials.

For instance, a polymeric support structure may not maintain a desired level of rigidity over a wide range of operating temperatures, and may be subject to gradual deformation or mechanical failure over the lifetime of a device. As such failures may affect the distance between the movable layer and the optical stack, and this distance at least partially determines the wavelengths reflected by the interferometric modulator element, such failures may lead to a shift in the reflected color due to wear over time or variance in operating temperatures. Other MEMS devices experience analogous degradation over time when supports are formed of polymeric material.

Figure 9A:
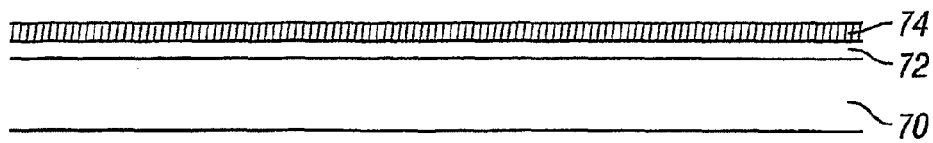
FIGS. 9A-9J are schematic cross-sections illustrating a method for fabricating an interferometric modulator element comprising support structures located over a movable layer.

One process for forming an interferometric modulator element comprising overlying rivet support structures is described with respect to FIGS. 9A-9J. In FIG. 9A, it can be seen that a transparent or light-transmissive substrate 70 is provided, which may comprise, for example, glass or a transparent polymeric material. A conductive layer 72, which may comprise indium-tin-oxide (ITO), is then deposited over the transparent substrate and a partially reflective layer 74, which may comprise chromium, is deposited over the conductive layer 72. Although in one embodiment conductive layer 72 may comprise ITO, and may be referred to as such at various points in the below specification, it will be understood that the layer 72 may comprise any suitable conductive material, and need not be transparent for non-optical MEMS structures. Similarly, although sometimes referred to as a chromium layer, partially reflective layer 74 may comprise any suitable partially reflective layer, and may be omitted for non-optical MEMS structures.

Figure 9B:
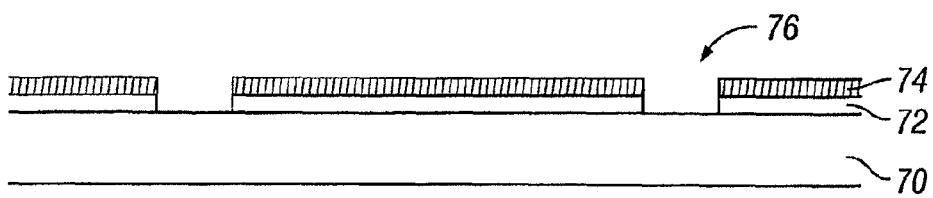

The conductive layer 72 and partially reflective layer 74 are then patterned and etched to form bottom electrodes, also referred to as row electrodes, which run cross-wise (e.g., perpendicular) to the movable layer 66 of FIG. 8 and which will be used to address a row of MEMS elements. In certain embodiments, the conductive and partially reflective layers 72 and 74 may advantageously also be patterned and etched to remove the ITO and chromium underlying the areas where the support post structures will be located, forming apertures 76 as depicted in FIG. 9B. This patterning and etching is preferably done by the same process which forms the row electrodes. The removal of ITO and chromium (or other conductive materials) underlying the support structures helps to minimize risk of shorting between an overlying conductive layer, such as the movable layer, and the bottom electrode. Thus, FIG. 9B and the subsequent figures depict a cross-section of a continuous row electrode formed by layers 72 and 74, in which isolated apertures 76 have been etched, taken along a line extending through those apertures. In other embodiments in which the conductive layer 72 and partially reflective layer 74 are not etched to form apertures 76, a dielectric layer, discussed below, may provide sufficient protection against shorting between the bottom electrode and the movable layer.

Figure 9C:
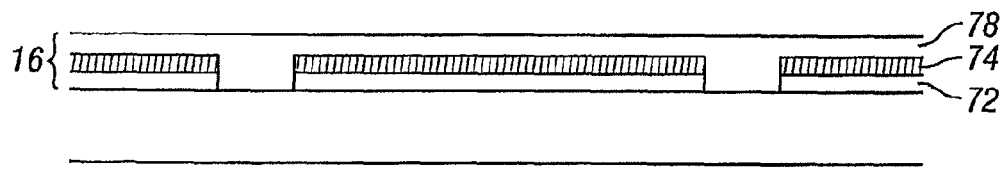

The conductive layer 72 and partially reflective layer 74 may be patterned via photolithography and etched via, for example, commercially available wet etches. Chromium wet etches include solutions of acetic acid ($C_2H_4O_2$) and cerium ammonium nitrate [$Ce(NH_4)_2(NO_3)_6$]. ITO wet etches include HCl, a mixture of HCl and $HNO_3$, or a mixture of $FeCl_3$/HCl/DI in a 75%/3%/22% ratio and $H_2O$. Once the apertures 76 have been formed, a dielectric layer 78 is deposited over the conductive and partially reflective layers 72 and 74, as seen in FIG. 9C, forming the optical stack 16. In certain embodiments, the dielectric layer may comprise $SiO_2$ or $SiN_x$, although a wide variety of suitable materials may be used.

A variety of methods can be used to perform the patterning and etching processes discussed with respect to the various embodiments disclosed herein. The etches used may be either a dry etch or a wet etch, and may be isotropic or anisotropic. Suitable dry etches include, but are not limited to: $SF_6/O_2$, $CHF_3/O_2$, $SF_2/O_2$, $CF_4/O_2$, and $NF_3/O_2$. Generally, these etches are suitable for etching one or more of $SiO_x$, $SiN_x$, $SiO_xN_y$, spin-on glass, Nissan™ hard coat, and $TaO_x$, but other materials may also be etched by this process. Materials which are resistant to one or more of these etches, and may thus be used as etch barrier layers, include but are not limited to Al, Cr, Ni, and $Al_2O_3$. In addition, wet etches including but not limited to PAD etches, BHF, KOH, and phosphoric acid may be utilized in the processes described herein, and may generally be used to etch metallic materials. Generally, these etches may be isotropic, but can be made anisotropic through the use of a reactive ion etch (RIE), by ionizing the etch chemicals and shooting the ions at the substrate. The patterning may comprise the deposition of a photoresist (PR) layer (either positive or negative photoresist), which is then used to form a mask. Alternately, a hard mask can be utilized. In some embodiments, the hard mask may comprise metal or $SiN_x$, but it will be understood that the composition of the hard mask may depend on the underlying materials to be etched and the selectivity of the etch to be used. The hard mask is typically patterned using a PR layer, which is then removed, and the hard mask is used as a mask to etch an underlying layer. The use of a hard mask may be particularly advantageous when a wet etch is being used, or whenever processing through a mask under conditions that a PR mask cannot handle (such as at high temperatures, or when using an oxygen-based etch). Alternate methods of removing layers may also be utilized, such as an aching etch or lift-off processes.

The thickness and positioning of the layers forming the optical stack 16 determines the color reflected by the interferometric modulator element when the element is actuated (collapsed), bringing the movable layer 66 into contact with the optical stack. In certain embodiments, the optical stack is configured such that the interferometric modulator element reflects substantially no visible light (appears black) when the movable layer is in an actuated position. Typically, the thickness of the dielectric layer 78 is about 450 Å, although it will be understood that the desired thickness will vary based on both the refractive index of the material and the desired color reflected by the interferometric modulator in a collapsed state. While illustrated for simplicity as planar (which can be achieved if the dielectric layer 78 is a spin-on glass), the dielectric layer 78 is typically conformal over the patterned lower electrode formed from layers 72 and 74.

Figure 9D:
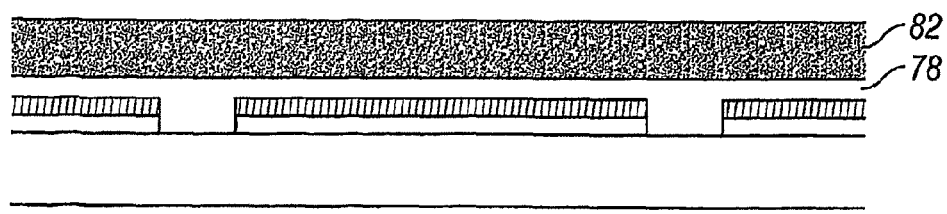

As seen in FIG. 9D, a layer 82 of sacrificial material is then deposited over the dielectric layer 78. In certain embodiments, this sacrificial layer 82 is formed from a material which is etchable by fluorine-based etchants, particularly $XeF_2$. For example, the sacrificial layer 82 may be formed from molybdenum or amorphous silicon (a-Si). In other embodiments, the sacrificial layer may comprise tantalum or tungsten. Other materials which are usable as sacrificial materials include silicon nitride, certain oxides, and organic materials. The thickness of the deposited sacrificial layer 82 will determine the distance between the optical stack 16 and the movable layer 66, thus defining the dimensions of the interferometric gap 19 (see FIG. 7A). As the height of the gap 19 determines the color reflected by the interferometric modulator element when in an unactuated position, the thickness of the sacrificial layer 82 will vary depending on the desired characteristics of the interferometric modulator. For instance, in an embodiment in which a modulator element that reflects green in the unactuated position is formed, the thickness of the sacrificial layer 82 may be roughly 2000 Å. In further embodiments, the sacrificial layer may have multiple thicknesses across an array of MEMS devices, such as in a multi-color display system where different interferometric gap sizes are used to produce different colors.

Figure 9E:
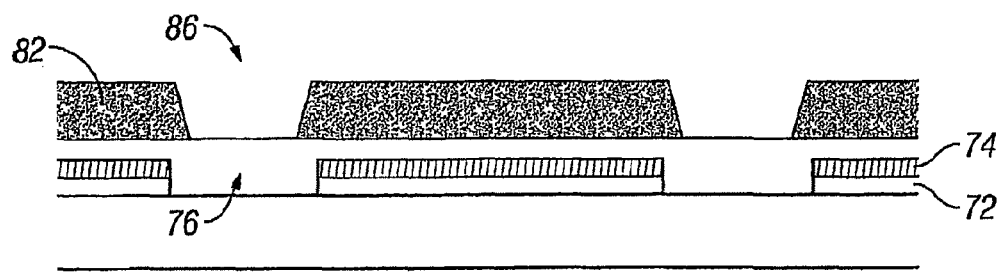

In FIG. 9E, it can be seen that the sacrificial layer 82 has been patterned and etched to form tapered apertures 86. The apertures 86 overlie the apertures 76 cut into the layers 72 and 74 of ITO and chromium. These apertures 86 may be formed by masking the sacrificial layer, using photolithography, and then performing either a wet or dry etch to remove portions of the sacrificial material. Suitable dry etches include, but are not limited to, $SF_6$, $CF_4$, $Cl_2$, or any mixture of these gases with $O_2$ or a noble gas such as He or Ar. Wet etches suitable for etching Mo include a PAN etch, which may be a mix of phosphoric acid, acetic acid, nitric acid and deionized water in a 16:1:1:2 ratio. Amorphous silicon can be etched by wet etches including KOH and HF Nitrate. Preferably, however a dry etch is used to etch the sacrificial layer 82, as dry etches permit more control over the shape of tapered apertures 86.

Figure 9F:
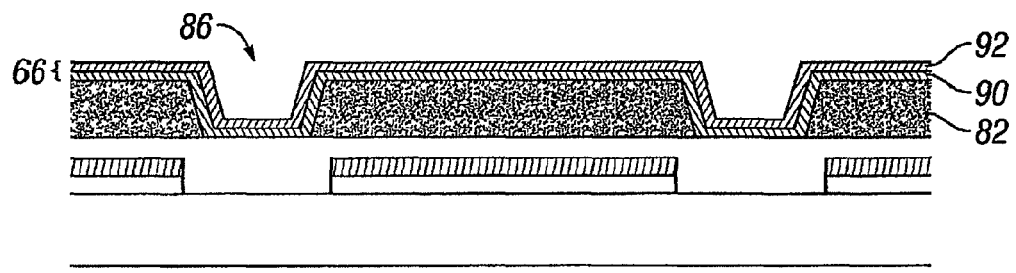

In FIG. 9F, it can be seen that the components which will form the movable layer 66 (see, e.g., moveable reflective layer 14 in FIG. 7A) are then deposited over the etched sacrificial layer 82, lining the tapered apertures 86. In the embodiment of FIG. 9F, a highly reflective layer 90, also referred to as a mirror or mirror layer, is deposited first, followed by a mechanical layer 92. The highly reflective layer 90 may be formed from aluminum or an aluminum alloy, due to their high reflectance over a wide spectrum of wavelengths. The mechanical layer 92 may comprise a metal such as Ni and Cr, and is preferably formed such that the mechanical layer 92 contains residual tensile stress. The residual tensile stress provides the mechanical force which pulls the movable layer 66 away from the optical stack 16 when the modulator is unactuated, or "relaxed." For convenience, the combination of the highly reflective layer 90 and mechanical layer 92 may be collectively referred to as movable layer 66, although it will be understood that the term movable layer, as used herein, also encompasses a partially separated mechanical and reflective layer, such as the mechanical layer 34 and the movable reflective layer 14 of FIG. 7C.

In an embodiment in which the sacrificial layer is to be etched by a $XeF_2$ etch, both the reflective layer 90 and the mechanical layer 92 are preferably resistant to $XeF_2$ etching. If either of these layers is not resistant, an etch stop layer may be used to protect the non-resistant layer. It can also be seen that the taper of the tapered apertures 86 facilitates the conformal deposition of the reflective layer 90 and mechanical layer 92. Absent this taper, it may be difficult to deposit these layers such that the layers have substantially even thicknesses over surfaces outside and within the apertures 86.

In an alternate embodiment, the movable layer 66 may comprise a single layer which is both highly reflective and has the desired mechanical characteristics. However, the deposition of two distinct layers permits the selection of a highly reflective material, which might otherwise be unsuitable if used as the sole material in a movable layer 66, and similarly allows selection of a suitable mechanical layer without regard to its reflective properties. In yet further embodiments, the movable layer may comprise a reflective sublayer which is largely detached from the mechanical layer, such that the reflective layer may be translated vertically without bending (See, e.g., FIGS. 7C-7E and attendant description). One method of forming such an embodiment comprises the deposition of a reflective layer over the sacrificial layer, which is then patterned to form individual reflective sublayers. A second layer of sacrificial material is then deposited over the reflective layer and patterned to permit the connections to be made through the second sacrificial layer between the mechanical sublayer and the reflective sublayers, as well as to form tapered apertures for the support structures.

In other embodiments in which the MEMS devices being formed comprise non-optical MEMS devices (e.g., a MEMS switch), it will be understood that the movable layer 66 need not comprise a reflective material. For instance, in embodiments in which MEMS devices such as MEMS switches are being formed comprising the support structures discussed herein, the underside of the movable layer 66 need not be reflective, and may advantageously comprise a single layer, selected solely on the basis of its mechanical properties or other desirable properties.

Figure 9G:
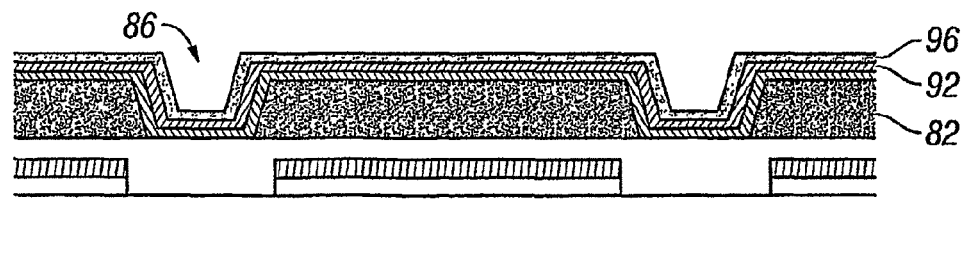

In FIG. 9G, a rigid layer 96, also referred to as a rivet layer, is deposited over the mechanical layer 92. As the rivet layer 96 will form a structure which provides support and stability to the underlying mechanical layer 92 but will not be substantially deformed during actuation of the modulator, the material forming the rivet layer 96 need not be as flexible as that forming the mechanical layer 92. Suitable materials for use in the rivet layer 96 include, but are not limited to, aluminum, $AlO_x$, silicon oxide, $SiN_x$, nickel and chromium. Alternate materials which may be used to form the rivet structure include other metals, ceramics, and polymers. The thickness of the rivet layer 96 will vary according to the mechanical properties of the material used.

As discussed with respect to the mechanical and reflective layers, it may be desirable to select for the rivet layer 96 a material that is resistant to $XeF_2$ etching, which may be used to etch the sacrificial layer in certain embodiments. In addition, the rivet layer 96 is preferably selectively etchable with respect to the upper surface of underlying movable layer 66, which in the illustrated embodiment is mechanical layer 92, so as to permit etching of the rivet layer 96 while leaving the movable layer 66 unaffected. However, if the rivet layer 96 is not selectively etchable relative to the movable layer 66, an etch stop layer (not shown) may be provided between the rivet layer 96 and the movable layer 66.

Figure 9H:
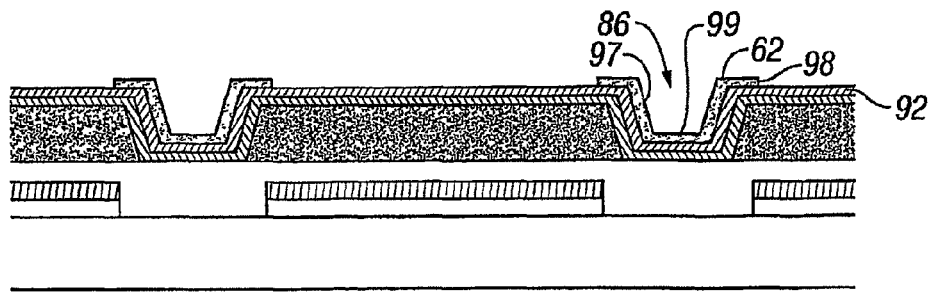

In FIG. 9H, the rivet layer 96 is patterned via photolithography and etched to remove portions of the rivet layer 96 located away from the apertures 86, forming support structures 62, also referred to as rivet structures, located adjacent the movable layer 66. It will be understood that the support structures can be considered adjacent the movable layer even if an intervening layer, such as an etch barrier layer, is located between the supports The etching of the rivet layer 96 may be performed by either a wet etch or a dry etch. In embodiments in which the rivet layer 96 comprises aluminum, suitable wet etches include phosphoric acid or bases such as KOH, TMAH, and NaOH, and a suitable dry etch uses $Cl_2$. In other embodiments in which the rivet layer 96 comprises $SiO_2$, a mixture of fluorine-bases gases and either $O_2$ or noble gases may be used as a dry etch, and HF or buffered oxide etch (BOE) are suitable wet etches.

Referring still to FIG. 9H, it can be seen that the support structures 62 may comprise a lip area 98, where the support structure 62 extends out of the tapered aperture 86 over the upper surface of the mechanical layer 92. Advantageously, the size of this lip can be minimized, as the lip constrains deflection of the underlying mechanical layer, reducing the active area of the interferometric modulator element. However, in certain embodiments, some minimal lip portion 98 is desirable for support. As can be seen in the illustrated embodiment, the support structures 62 may also comprise a sloped sidewall portion 97 and a substantially flat base area 99.

Figure 9I:
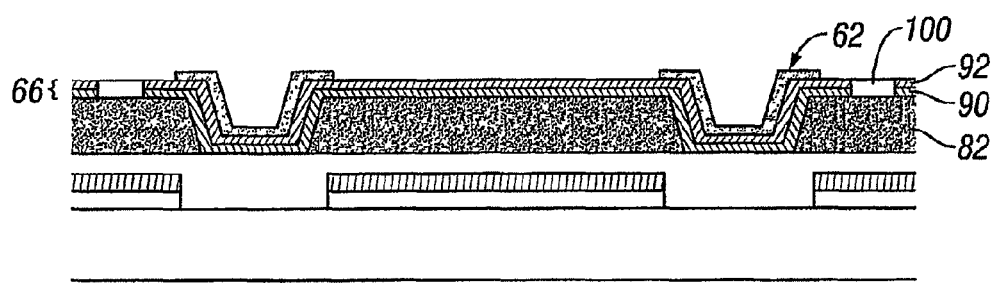

Next, in FIG. 9I, it can be seen that photolithography is used to pattern the mechanical layer 92, and etch the movable layer 66 (i.e., the mechanical layer 92 and the reflective layer 90) to form etch holes 100, which expose portions of the sacrificial layer 82, in order to facilitate etching of the sacrificial layer. In certain embodiments, multiple etches are employed to expose the sacrificial layer. For example, if the mechanical layer 92 comprises nickel and the reflective layer 90 comprises aluminum, $HNO_3$ may be used to etch the mechanical layer 92, and phosphoric acid or a base such as $NH_4OH$, KOH, THAM, or NaOH may be used to etch the reflective layer 90. This patterning and etching may also be used to define the strip electrodes seen in FIG. 8, by etching gaps 65 between strips of the movable layer 66 (see FIG. 8), separating columns of MEMS devices from one another.

Figure 9J:
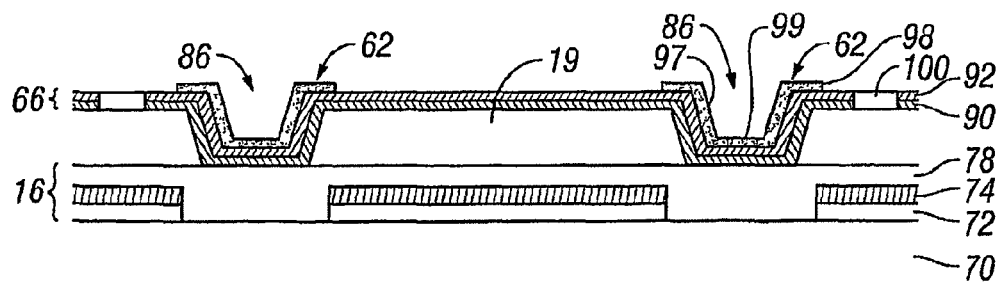

Finally, in FIG. 9J, it can be seen that a release etch is performed to remove the sacrificial layer, creating the interferometric gap 19 through which the movable layer 66 can move. In certain embodiments, a $XeF_2$ etch is used to remove the sacrificial layer 82. Because $XeF_2$ etches the sacrificial materials well, and is extremely selective relative to other materials used in the processes discussed above, the use of a $XeF_2$ etch advantageously permits the removal of the sacrificial material with very little effect on the surrounding structures.

Thus, FIG. 9J depicts a portion of an interferometric modulator element such as one of the interferometric modulator elements 60 of FIG. 8, shown along line 9J-9J. In this embodiment, the movable layer 66 is supported throughout the gap 19 by support structures 62 formed over depressions 86 in the movable layer 66. As discussed above, portions of the underlying optical stack 16 have advantageously been etched so as to minimize risk of shorting between conductive portions of the optical stack 16 and conductive layers in the movable layer 66, although this step need not be performed in all embodiments.

In another embodiment, the support structures may take the form of posts, and preferably inorganic posts, underlying the movable layer. An exemplary process for fabricating an interferometric modulator comprising inorganic support posts includes the steps of FIGS. 9A-9E, and is discussed with respect to FIGS. 10A-10D. For convenience, the combination of the layers 72, 74, and 78 is referred to herein as the optical stack 16, and is indicated by a single layer in later figures, for convenience. It will be understood that, as discussed above, the composition of the optical stack 16 may vary both in the number of layers and the components of those layers, and that the layers discussed above are merely exemplary.

Figure 10A:
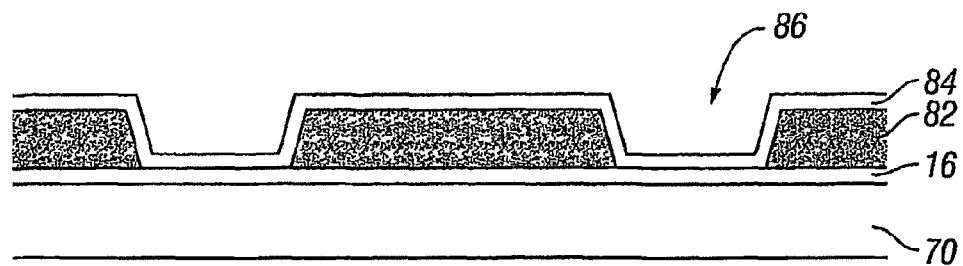
FIGS. 10A-10D are schematic cross-sections illustrating a method for fabricating an interferometric modulator element comprising support structures located underneath a movable layer.
Figure 10B:
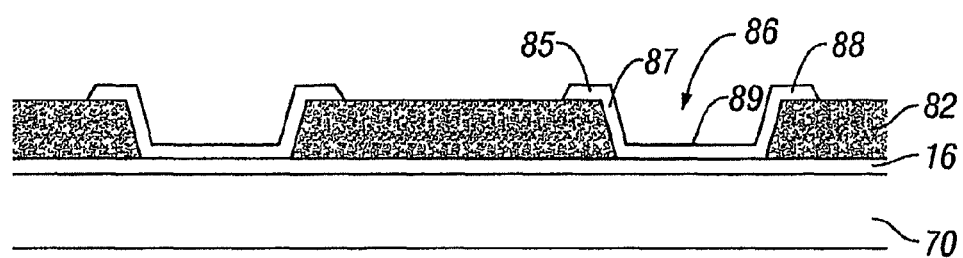

In FIG. 10A, a layer 84 of inorganic post material is deposited over the patterned sacrificial layer 82, such that the inorganic post layer 84 also coats the sidewalls and the base of the tapered apertures 86. In certain embodiments, the inorganic post layer 84 is thinner than the sacrificial layer 82, and is conformal over the sacrificial layer 82. In certain embodiments, the inorganic post layer 84 may comprise silicon nitride ($SiN_x$) or $SiO_2$, although a wide variety of other materials may be used, some of which are discussed in greater detail below. In FIG. 10B, the inorganic post layer 84 is patterned and etched to form inorganic posts 88. It can be seen in FIG. 10B that the edges of the inorganic posts 88 preferably taper which, like the tapered or sloped sidewalls of the apertures 86, facilitate continuous and conformal deposition of overlying layers. It can be seen that the post structure 88 in the illustrated embodiment has a thickness which is thinner than that of the sacrificial layer 82, and comprises a substantially flat base portion 89, a sloped sidewall portion 87, and a substantially horizontal wing portion 85 which extends over a portion of the sacrificial material. Thus, the post 88 advantageously provides a substantially flat surface at the edge of the post for supporting an overlying movable layer 66 (see FIG. 10D), minimizing stress and the resultant undesired deflection which might occur if the movable layer 66 were deposited over a less flat edge.

In one embodiment, the inorganic post layer 84 and resultant post 88 comprise diamond-like carbon (DLC). In addition to being extremely hard and stiff (roughly 10× harder than $SiO_2$), the DLC inorganic post layer 84 can be etched with an $O_2$ dry etch. Advantageously, an $O_2$ dry etch is highly selective relative to a wide variety of sacrificial materials, including but not limited to Mo and a-Si sacrificial material, as well as other sacrificial materials discussed above. An inorganic post comprising DLC thus provides a very stiff post, lessening the likelihood and amount of downward flexure of the edges of the support post 88 when overlying moving or mechanical layers are pulled downward during MEMS operation, while permitting the use of an etch which is relatively benign to a wide variety of materials.

Figure 10C:
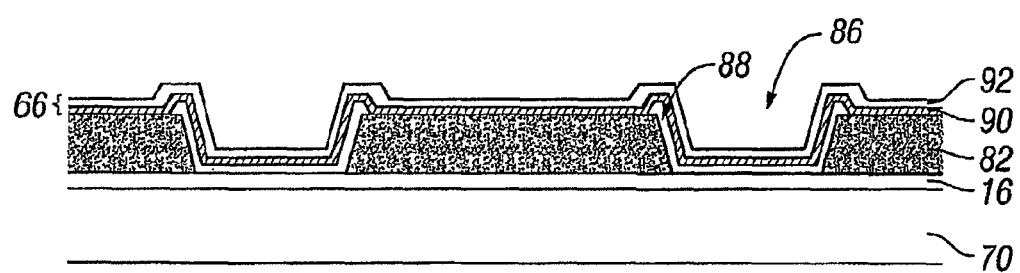
Figure 10D:
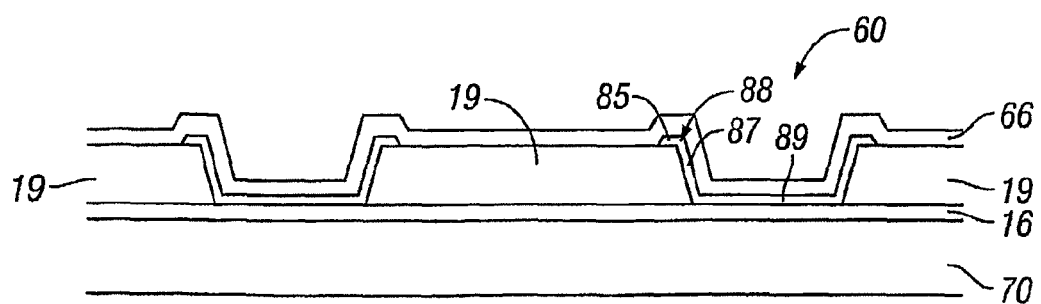

In FIG. 10C, a highly reflective layer 90 is deposited over the inorganic posts 88 and the exposed portions of the sacrificial layer 82. A mechanical layer 92 is then deposited over the highly reflective layer 90. For convenience, as noted above, the highly reflective layer 90 and the mechanical layer 92 may be referred to and depicted in subsequent figures as a movable layer 66 (see FIG. 10D), or more particularly as a deformable reflective layer whenever the mechanical layer 92 is deposited directly over the highly reflective layer 90. In alternate embodiments, the movable layer 66 may comprise a single layer which has the desired optical and mechanical properties. For example, mechanical or moving layers for MEMS mechanical switches need not include reflective layers. In still further embodiments, as already discussed, the movable layer may comprise a mechanical layer and a reflective layer which are substantially separated, such as layers 14 and 34 of FIG. 7C. In FIG. 10D, a release etch is performed to selectively remove the sacrificial layer 82, forming an interferometric modulator element 60 having an interferometric gap 19 through which the movable layer 66 can be moved in order to change the color reflected by the interferometric modulator element 60. Prior to the release etch, the movable layer 66 is preferably patterned to form columns (not shown), and may advantageously be further patterned to form etch holes (see, e.g., etch holes 100 in FIG. 9J) which facilitate access to the sacrificial layer by the release etch.

Undesired flexure of the support structures and the mechanical layer may occur as a result of a tendency for the layers within the post structure to expand or contract relative to the other layers in a lateral direction along the length of the layers, particularly the layers within the support structures and the movable layer. In some situations, these tendencies are the result of inherent stresses within the materials forming the support structures and the movable layer, which are a function of the materials forming those layers and the manner of deposition. An additional source of such tendency for relative deformation is the differential thermal expansion of the layers, which is a function of the mismatch between the coefficients of thermal expansion of two different materials; the operating temperature of the MEMS device; the moduli of elasticity of the materials; and the material deposition conditions. When adjoining or otherwise integrated layers have different coefficients of thermal expansion, deflection may not only be caused by the relative change in size of integrated layers, but the total deflection may vary as the result of the operating temperature. Because such deflection will alter the height of the interferometric cavity, and therefore affect the color reflected by the interferometric modulator element, it is desirable to eliminate or minimize such deflection to the extent possible. Similar problems can arise for non-optical MEMS. It will be understood that the term "tendency to expand or contract" and similar terms is used herein to refer to both tendencies for relative deformation which are brought about as a result of unbalanced residual stresses in the affected area (such as the support post region), and stresses that result due to, for example, deformation brought about as a result of differing coefficients of thermal expansion in integrated or adjoining layers.

In one embodiment, the materials and thicknesses of the support structures are selected such that the tendency of certain layers in the region of the support structures to laterally expand or contract with respect to one another is minimized, so that deflection of the edges of the support structure is minimized or eliminated. In a particular embodiment, depicted in FIG. 11, the interferometric modulator element comprises a rivet structure 62 formed over a mechanical layer 92 and a reflective layer 90, which together form a movable layer 66. In order to avoid such tendencies for relative deformation in the materials at the edge of the rivet 62, the rivet 62 is formed from layers having about the same internal stresses as the mechanical layer 92 and the reflective layer 90, preferably the same materials and thicknesses, such that the rivet 62 is substantially a mirror image of the movable layer 66. Preferably, the thicknesses of the corresponding layers are within 5% of one another. Thus, in the present embodiment, the rivet 62 comprises a first sublayer 110, which is the same thickness and material as the mechanical layer 92, and also comprises a second sublayer 112, which is the same thickness and material as the reflective layer 90. Advantageously, because the rivet 62 and deformable movable layer 66 are formed from the same material 66, the coefficients of thermal expansion of the corresponding layers are equal. Although the sublayer 110 may expand or contract at a different rate than the sublayer 112 due to differing coefficients of thermal expansion, any stresses caused by this disparity will be substantially cancelled out by opposite stresses in the symmetrical underlying layers.

Because the sublayer 110 should be selectively etched relative to the mechanical layer 92 in order to form the rivet structure 62, but is formed from the same material as the mechanical layer 124, an etch stop layer 114 may be deposited between the sublayer 110 and the mechanical layer 92, as illustrated. While residual stresses within the etch stop layer 114 will not be balanced by stresses within any other layer, the symmetry of this embodiment results in the etch stop layer 114 being located along or very close to the neutral axis of the structure. Thus, any stresses within the etch stop layer 114, or any stresses due to the thermal expansion of the layer 114 relative to the other layers, will not exert significant moments on the structure, and will not result in significant deflection either upwards or downwards. In certain embodiments, the etch stop layer 114 may comprise materials deposited by either chemical vapor deposition or plasma-enhanced chemical vapor deposition including, but not limited to, $SiO_2$, TEOS, carbon-doped oxides, or $SiN_x$. Silicon oxide-based materials serve as suitable etch stop layers when the rivet and mechanical layers comprise Ni, Cr, or NiCr alloys. These etch stop layers may have thicknesses of between 200 and 2000 Angstroms, but may also be thicker or thinner. Other etch barrier layers may also be used. One etch suitable for etching certain rivet layers (e.g., Ni, Cr or NiCr alloys) relative to the etch stop layer (e.g., a form of silicon oxide or silicon nitride) is a nitric acid ($HNO_3$) etch. Etches suitable for removal of such etch barrier layers selectively relative to the rivet/mechanical layers include, but are not limited to, fluorine-based (e.g., reactive ion etch) etches or buffered oxide etch (BOE) wet etches.

Multiple variations on the above structure are possible. It is possible to select a material or materials for use in the rivet structure 62 which are not identical to the materials in the movable layer 66, but which will contain a net residual stress which is similar or identical to that in the movable layer 66, providing the desired effect. Advantageously, some of these materials may be selectively etchable relative to the mechanical layer 92, obviating the etch barrier layer 114. Similarly, materials may be selected which will eliminate or minimize deflection of the total structure as a result of the differing thermal expansion of the component layers.

In a further embodiment, the above structures may be modified to eliminate or minimize deflection of the support structures, particularly at the edges, in embodiments in which rivet structures 62 overlie inorganic posts 88. In one particular embodiment, shown in FIG. 12, the rivets 62 and the inorganic posts 88 are formed from substantially identical materials in layers having substantially the same thicknesses. If the rivets 62 and inorganic posts 88 comprise multiple layers, they are preferably formed in a symmetric fashion such that the rivet 62 is a mirror image (in terms of layers) of the inorganic post 88. In a similar fashion to that discussed above with respect to the embodiment of FIG. 11, the residual stresses within the rivets 62 and inorganic posts 88 will balance one another out. Any residual stresses within the movable layer 66 will not be balanced out, but as the stresses will act along a line close to the neutral axis of the support structure, any deformation resulting from these stresses will be minimized or eliminated. In embodiments in which the inorganic posts 88 and rivets 62 are thick relative to the movable layer 66, or are formed from significantly stiffer material, any deflection can be further minimized.

Figure 13:
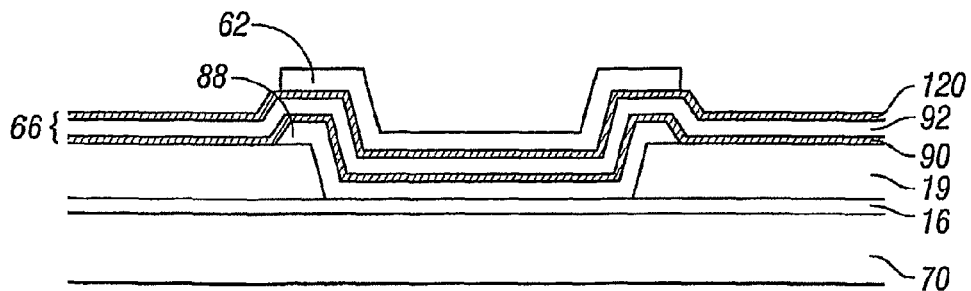
FIG. 13 is a schematic cross-section of an interferometric modulator element, such as the modulator element of FIG. 12, in which the movable layer is formed from layers which are symmetric with respect to one another.

In a further embodiment, the movable layer 66 may itself be made symmetric, as shown in FIG. 13. In an optical MEMS device, such as an interferometric modulator, in which viewing is from the substrate 70 side, although the upper surface of the movable layer 66 need not be reflective, the addition of a reflective layer to the upper surface of the MEMS device will not have an adverse effect on certain embodiments of optical MEMS devices. Thus, the embodiment of FIG. 13 includes a movable layer 66 which comprises an upper sublayer 120, which in one embodiment comprises the same material as the reflective layer 90. It can be seen that, in addition to symmetrical posts 88 and rivets 62, the movable layer 66 is itself symmetric, such that any residual stresses within the reflective layer 90 and the upper sublayer 120 cancel one another out, and any stresses within the mechanical layer 92 will act substantially along the neutral axis of the structures, such that no significant moments will be exerted by these stresses. Advantageously, the upper sublayer 120 may additionally serve as an etch barrier layer, enabling the use of rivet and post materials which are not selectively etchable relative to the mechanical layer (e.g., the use of nickel, chrome, or a nickel-chrome alloy for each of the separately patterned mechanical layer, post, and rivet).

Figure 11:
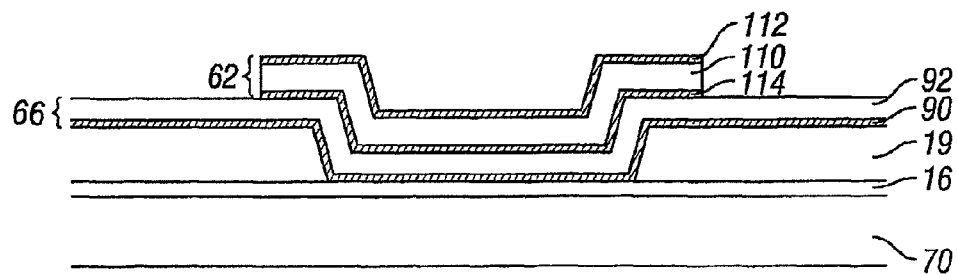
FIG. 11 is a schematic cross-section illustrating an embodiment of an interferometric modulator element in which an overlying rivet structure is a mirror image of the movable layer.
Figure 12:
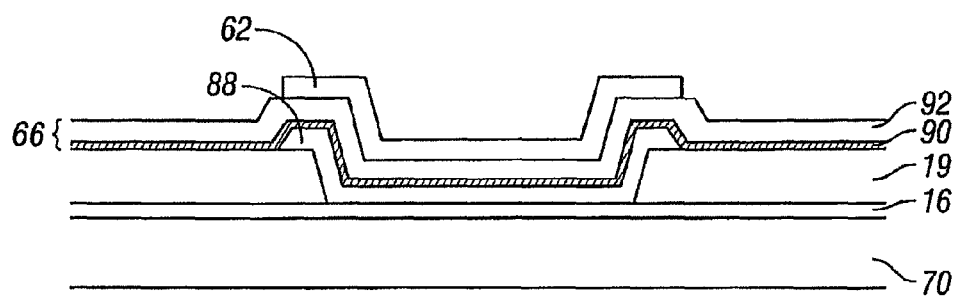
FIG. 12 is a schematic cross-section illustrating an embodiment of an interferometric modulator element in which an overlying rivet structure is substantially identical in material and thickness to an underlying post structure.
Figure 14:
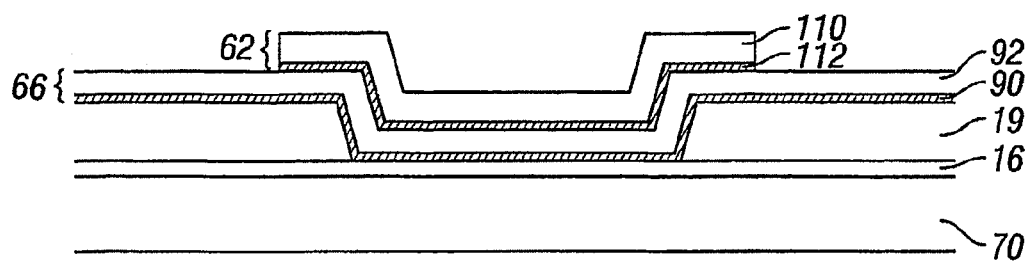
FIG. 14 is a schematic cross-section of an interferometric modulator element in which an overlying rivet structure is substantially identical in material and thickness to the movable layer.

In another embodiment, shown in FIG. 14 a variation is made to the embodiment in FIG. 11, in which the locations of the sublayers 110 and 112 are reversed. Thus, in one embodiment, a second sublayer 112 of about the same material and thickness as the reflective layer 90 is deposited over the mechanical layer 92, and a first sublayer 110 of about the same material and thickness as the mechanical layer 92 is deposited over the second sublayer 112. Therefore, the rivet 62 has the same structure as the deformable reflective layer (which comprises the mechanical and reflective layers), but unlike the embodiment of FIG. 11, the rivet is not a mirror image of the deformable reflective layer, but is rather merely symmetrical. The second sublayer 112 may itself serve as an etch barrier layer, or may be deposited over a separate etch barrier layer (not shown, similar to that of FIG. 13). In a particular embodiment, the reflective layer comprises Al, and the mechanical layer comprises Ni. Advantageously, the Al will adhere to various etch stop layers better than the Ni, and the symmetry of the rivet and the deformable reflective layer minimizes the undesired deflection, even though the rivet and the deformable reflective layer are not mirror images.

Figure 15:
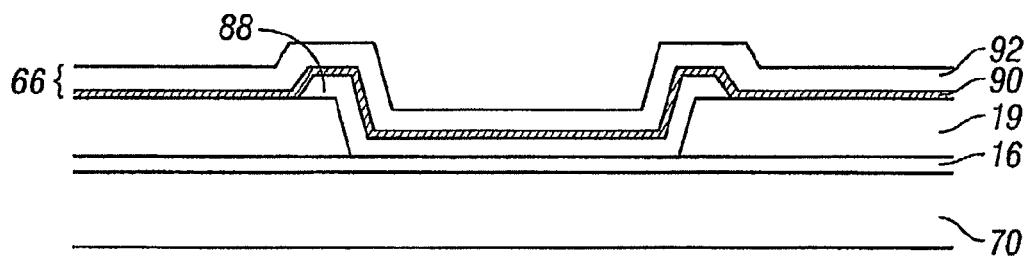
FIG. 15 is a schematic cross-section of an interferometric modulator element in which an underlying post structure is substantially identical in material and thickness to the movable layer.

In another embodiment, the structures discussed above may be applied to post structures, rather than rivet structures. This, FIG. 15 depicts an embodiment in which a post structure 88 is substantially the same thickness and comprises substantially the same material as the mechanical layer 92. It will be understood that, as the reflective layer 90 runs essentially along the central portion of the post structure, any tendency to laterally deform will result in minimal, if any, deflection of the edge of the support structure. As the post layer in the illustrated embodiment comprises substantially the same material as the mechanical layer 92, it will be understood that such a post is preferably formed comprises a metal, such as nickel or chrome.

It will be understood that the above structures may be modified to minimize the tendencies for relative deformation in the support structure region in MEMS element having a substantially separated mechanical and reflective layer, such as the interferometric modulators depicted in and described with respect to FIGS. 7C-7E. In such an embodiment, in which the reflective layer is detached from the portion of the mechanical layer located within the support post region, any tendency for deformation within the mirror layer will not result in the deflection of the support structure. Thus, in one embodiment, an adjacent support structure, such as a post or rivet structure, can be formed from the same material and the same thickness as the mechanical layer, and an etch stop layer can be formed between the support structure and the mechanical layer, permitting selective etching of one of the support structure or mechanical layer. In another embodiment, substantially symmetrical post and rivet structures may be formed on either side of the mechanical layer, and if desired, etch stop layers may be formed between the support structures and the mechanical layers.

It will be understood that various combinations of the above embodiments are possible. Various other combinations of the support structures discussed above are contemplated and are within the scope of the invention. In addition, it will be understood that support structures formed by any of the methods above may be utilized in combination with other methods of forming support structures, in order to improve the rigidity and durability of those support structures, or to minimize the tendency of layers within the support structure area to laterally deform with respect to one another.

It will also be recognized that the order of layers and the materials forming those layers in the above embodiments are merely exemplary. Moreover, in some embodiments, other layers, not shown, may be deposited and processed to form portions of an MEMS device or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. An electromechanical device, comprising:
a substrate;
an electrode layer located over the substrate; and a movable layer located over the electrode layer, wherein the movable layer is generally spaced apart from the electrode layer by an air gap, wherein the movable layer comprises:
- a reflective sublayer on the side of the movable layer facing the electrode layer, the reflective sublayer having a residual internal stress;
- a mechanical sublayer; and
- an upper sublayer on the opposite side of the mechanical sublayer from the reflective sublayer, the upper sublayer having a residual internal stress;
wherein the residual internal stress of the reflective sublayer is balanced by the residual internal stress of the upper sublayer.

2. The electromechanical device of claim 1, wherein the reflective sublayer and the upper sublayer comprise substantially the same material.

3. The electromechanical device of claim 2, wherein the reflective sublayer and the upper sublayer have substantially the same thickness.

4. The electromechanical device of claim 1, wherein the coefficient of thermal expansion of the reflective sublayer is substantially equal to the coefficient of thermal expansion of the upper sublayer.

5. The electromechanical device of claim 1, further comprising at least one underlying support structure underlying the movable layer.

6. The electromechanical device of claim 5, further comprising at least one overlying support structure overlying the movable layer, wherein the overlying support structure substantially overlies the underlying support structure, and wherein a residual stress in the overlying support structure is substantially balanced by a residual stress in the underlying support structure.

7. The electromechanical device of claim 6, wherein the overlying support structure and the underlying support structure comprise substantially the same material.

8. The electromechanical device of claim 1, further comprising a partially reflective layer located on the same side of the air gap as the electrode layer.

9. The electromechanical device of claim 1, wherein the MEMS device comprises an interferometric modulator.

10. The electromechanical device of claim 1, additionally comprising:
- a processor that is configured to communicate with at least one of said electrode layer and said movable layer, said processor being configured to process image data; and
- a memory device that is configured to communicate with said processor.

11. The electromechanical device of claim 10, further comprising a driver circuit configured to send at least one signal to at least one of said electrode layer and said movable layer.

12. The electromechanical device of claim 11, further comprising a controller configured to send at least a portion of the image data to the driver circuit.

13. The electromechanical device of claim 10, further comprising an image source module configured to send said image data to said processor.

14. The electromechanical device of claim 13, wherein the image source module comprises at least one of a receiver, transceiver, and transmitter.

15. The electromechanical device of claim 10, further comprising an input device configured to receive input data and to communicate said input data to said processor.

16. A method of fabricating an electromechanical device, comprising:
providing a substrate;
depositing an electrode layer over the substrate;
depositing a sacrificial layer over the electrode layer;
patterning the sacrificial layer to form apertures; and
depositing a movable layer over the patterned sacrificial layer, wherein depositing a movable layer comprises:
- depositing a reflective sublayer, wherein the reflective sublayer comprises a material having an internal residual stress;
- depositing a mechanical sublayer over the reflective sublayer; and
- depositing an upper sublayer over the mechanical sublayer, wherein the upper sublayer comprises a material having an internal residual stress, and wherein the residual internal stress of the reflective sublayer is balanced by the residual internal stress of the upper sublayer.

17. The method of claim 16, additionally comprising etching the sacrificial layer to remove the sacrificial layer, thereby forming a cavity between the movable layer and the electrode layer.

18. The method of claim 16, wherein the reflective sublayer and the upper sublayer comprise substantially the same material.

19. The method of claim 18, wherein the reflective sublayer and the upper sublayer have substantially the same thickness.

20. The method of claim 16, additionally comprising forming a layer of partially reflective material over the substrate prior to forming the sacrificial layer.

* * * * *